United States Patent
Roehrer

(10) Patent No.: US 9,876,095 B2
(45) Date of Patent: Jan. 23, 2018

(54) HIGH-VOLTAGE TRANSISTOR WITH HIGH CURRENT LOAD CAPACITY AND METHOD FOR ITS PRODUCTION

(71) Applicant: ams AG, Unterpremstaetten (AT)

(72) Inventor: Georg Roehrer, Lebring (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 15/056,993

(22) Filed: Feb. 29, 2016

(65) Prior Publication Data

US 2016/0181401 A1 Jun. 23, 2016

Related U.S. Application Data

(62) Division of application No. 12/578,256, filed on Oct. 13, 2009, now Pat. No. 9,276,109.

(30) Foreign Application Priority Data

Oct. 10, 2008 (DE) .................. 10 2008 051 245

(51) Int. Cl.
| | | |
|---|---|---|
| H01L 29/66 | (2006.01) | |
| H01L 29/06 | (2006.01) | |
| H01L 29/08 | (2006.01) | |
| H01L 29/40 | (2006.01) | |
| H01L 29/423 | (2006.01) | |
| H01L 29/78 | (2006.01) | |

(Continued)

(52) U.S. Cl.
CPC .... *H01L 29/66681* (2013.01); *H01L 29/0653* (2013.01); *H01L 29/0847* (2013.01); *H01L 29/402* (2013.01); *H01L 29/42368* (2013.01); *H01L 29/66659* (2013.01); *H01L 29/7835* (2013.01); *H01L 21/266* (2013.01); *H01L 29/0692* (2013.01); *H01L 29/1045* (2013.01)

(58) Field of Classification Search
CPC ............ H01L 29/6681; H01L 29/0653; H01L 29/0847; H01L 29/402; H01L 29/42368; H01L 29/66659; H01L 29/783
See application file for complete search history.

(56) References Cited

U.S. PATENT DOCUMENTS

| | | | |
|---|---|---|---|
| 5,932,897 A | 8/1999 | Kawaguchi et al. | |
| 6,242,787 B1 | 6/2001 | Nakayama et al. | |

(Continued)

FOREIGN PATENT DOCUMENTS

| | | |
|---|---|---|
| DE | 10303232 A1 | 8/2003 |
| WO | 98/28797 A1 | 7/1998 |
| WO | 2006136979 A2 | 12/2006 |

OTHER PUBLICATIONS

J. Albers, "Grundlagen integrierter Schaltungen", vol. 12, pp. 157-159, 2007.

*Primary Examiner* — Laura Menz
*Assistant Examiner* — Candice Y Chan
(74) *Attorney, Agent, or Firm* — McDermott Will & Emery, LLP

(57) ABSTRACT

An isolation area (10) is provided over a drift region (12) with a spacing (d) to a contact area (4) provided for a drain connection (D). The isolation area is used as an implantation mask, in order to produce a dopant profile of the drift region in which the dopant concentration increases toward the drain. The implantation of the dopant can be performed instead before the production of the isolation area, and the later production of the isolation area (10) changes the dopant profile also in a way that the dopant concentration increases toward the drain.

14 Claims, 3 Drawing Sheets

(51) Int. Cl.
  *H01L 21/266*  (2006.01)
  *H01L 29/10*  (2006.01)

(56) References Cited

U.S. PATENT DOCUMENTS

| | | |
|---|---|---|
| 6,346,451 B1 | 2/2002 | Simpson et al. |
| 2002/0098637 A1 | 7/2002 | Hossain et al. |
| 2002/0135016 A1 | 9/2002 | Peake |
| 2004/0175892 A1 | 9/2004 | Wu |

HIGH-VOLTAGE TRANSISTOR WITH HIGH CURRENT LOAD CAPACITY AND METHOD FOR ITS PRODUCTION

CROSS-REFERENCE TO RELATED APPLICATIONS

This application is a divisional of U.S. patent application Ser. No. 12/578,256, filed Oct. 13, 2009, which claims the priority of German Application No. 10 2008 051 245 filed Oct. 10, 2008, all of which are hereby incorporated by reference in their entirety.

FIELD OF THE INVENTION

The present invention relates to high-voltage transistors that feature reduced body current, as well as to an associated production method.

BACKGROUND OF THE INVENTION

High-voltage transistors exhibit increased body current with increasing gate voltage for high drain-source voltage. The cause for this is the so-called Kirk effect that defines the area in which the component can be reliably operated (SOA, safe operating area), because a high body current causes an active breakdown. This effect can be reduced by gradually increasing the dopant profile toward the drain contact.

In US 2004/0175892 A1, a method is described in which the dopant is separated from a field oxide, in order to generate a graded dopant profile with an increasing dopant concentration toward the drain contact in the drift region in the horizontal direction relative to the top side of the substrate. This process is difficult to control and requires a production process with a field oxide, because otherwise additional complex processing steps are needed.

In WO 98/28797, it is described that the Kirk effect is reduced at the tips of drain contact areas which are structured like fingers, if the source area is absent in the area of the tips.

In the case of the method of WO 2006/136979 A2, tapering shallow trench isolation (STI) strips are used. The implantation of dopant into the drift region is performed with a smaller penetration depth in comparison with the depth of the STI area. In addition, the so-called dielectric RESURF effect (DIELER) is used. In this way, a relatively high breakdown voltage of typically approximately 35 V is achieved in a sub-micron CMOS process.

SUMMARY OF THE INVENTION

One object of the present invention is to provide a high-voltage transistor that has a reduced body current. Another object is to provide an especially suitable production method for this transistor.

This and other objects are attained in accordance with one aspect of the present invention directed to a high-voltage transistor with high current load capacity, comprising a substrate made from semiconductor material with a top side; doped wells arranged on the top side, wherein these wells comprise at least one first deep well provided for a drift region and one second deep well provided for a body area, a first contact area for a drain connection in the first deep well; a second contact area for a source connection in the second deep well; a gate dielectric arranged on the second deep well between the first contact area and the second contact area; an isolation area between the gate dielectric and the first contact area; a spacing between the isolation area and the first contact area; a gate electrode arranged on the gate dielectric, wherein this gate electrode forms a field plate on the isolation area; and wherein the first deep well has a dopant concentration that increases from the isolation area to the first contact area.

Another aspect of the present invention is directed to a method for production of a high-voltage transistor, comprising the steps of: providing doped wells and an isolation area on a top side of a substrate made from semiconductor material, where, of these wells, a first deep well is provided for a drift region running partially under the isolation area between the source and drain, and a second deep well is provided for a body area; and providing the first deep well with a dopant concentration that increases toward the drain.

In the case of an embodiment of the high-voltage transistor, an isolation area that is between the source and drain and that is arranged above the drift region is used for the construction of a dopant concentration that increases toward the drain. Doped wells are arranged on a top side of a substrate made from semiconductor material, wherein, of these wells, at least a first deep well is provided for a drift region and a second deep well doped opposite the first deep well is provided for a body area. A gate electrode is arranged over a portion of the body area and separated from the body area by a gate dielectric. An oppositely doped contact area for a source connection is provided in the body area.

An area of the first deep well follows the channel area in the direction toward the drain and toward another contact area that is provided for a drain connection and that is designated below as a drain-contact area. The first deep well contains a drift area for the charge carriers that are accelerated from the channel area toward the drain during operation of the transistor. The drift region runs in sections under an isolation area that can be a field oxide or an STI area. A field plate made from electrically conductive material that is connected to the gate electrode is arranged on this isolation area. The dopant concentration of the first deep well increases toward the drain-contact area. A spacing is provided between the isolation area and the drain-contact area. An implantation of the dopant for the first deep well is shielded by the isolation area, whereas it is not shielded between the isolation area and the drain-contact area.

A first possibility for generating an increase of the dopant concentration toward the drain involves generating the doping of the drift region with a masked implantation of the dopant in the area of the first deep well and, in this way, using the isolation area, preferably an STI area, as a semi-permeable mask. It can be limited to one implantation step, or also several implantations at different energies and implantation doses can be performed. The implantation is performed such that a portion of the implanted dopant penetrates through the isolation area into the semiconductor material of the substrate, while a residual portion of the dopant remains in the isolation area. The shaping of the isolation area, especially its boundary to the drain, can support the production of a suitably graded dopant profile along the drift region, so that the dopant concentration increases as provided toward the drain.

Another possibility for generating an increase of the dopant concentration toward the drain involves performing the implantation of the drift region before the production of the isolation area. In the case of this variant of the method, a shallow, surface film portion of the first deep well implanted with dopant is removed with a spacing from the drain, and thus dopant is removed from the relevant area. The isolation area is then preferably produced as an STI area. Therefore, in the section of the drift region remaining under the isolation area, the quantity of the originally implanted dopant is reduced, so that the dopant concentration increases toward the drain.

If a thermal budget is provided in the production process, an elevated-temperature processing step can be used to cause a diffusion of the dopant such that the pn junction between the channel area and the drift region likewise has a graded construction. The minimal dimensions of the openings of the implantation mask that is used for the implantation of the dopant provided for this diffusion are selected according to the diffusion lengths relevant for the elevated-temperature processing step. The diffusion depends on the magnitude of the thermal budget.

DETAILED DESCRIPTION OF THE DRAWINGS

Figure 1:
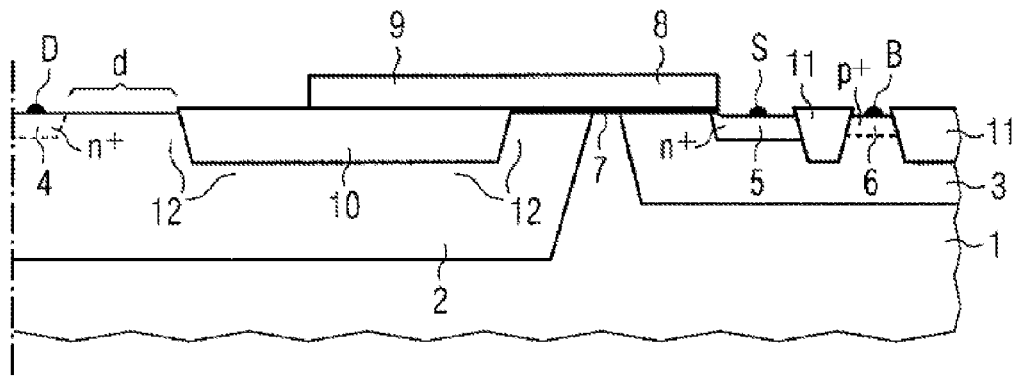
FIG. 1 shows a cross section through a first embodiment of the HV transistor.

FIG. 1 shows a cross section through an embodiment of the high-voltage transistor. This embodiment of the transistor involves an HV-NFET, in which the body area is connected to the substrate. However, the component structure according to the invention could also be used for isolated HV-NFETs and HV-PFETs. For the high-voltage transistor, a first deep well 2 and a second deep well 3 are provided on a top side of a substrate 1 made from semiconductor material, preferably from silicon. In the case of the example of an NFET, the first deep well 2 has an n-type conductivity doping and the second deep well 3 has a p-type conductivity doping. On the top side there are highly doped contact areas that are provided for the external connection of relevant components. A first contact area 4 has $n^+$-type conductivity doping in this example and is provided for the drain connection D that is shown schematically in FIG. 1. A second contact area 5 also has $n^+$-type conductivity doping and is provided for the source connection S. A third contact area 6 is highly doped for the opposite conductivity type, i.e., $p^+$-type conductivity, and is provided as the body connection B of the second deep well 3. The doped wells can be isolated by one or more pn junctions between additional wells. If that is not the case, as in the embodiment of FIG. 1, then the body connection B also acts as a substrate connection or bulk connection. The dashed contours of the first contact area 4 and the third contact area 6 are intended to indicate that the conductivity type does not change at these boundaries. In the case of an HV-PFET, the types of the contact areas shown in FIG. 1 are swapped; the first deep well 2 is then p-type conductivity and the second deep well 3 is n-type conductivity. In the case of an n-type conductivity body area and a p-type conductivity substrate, a $p^+$-type conductivity doped contact area can be provided outside of the second deep well 3 as a substrate connection. Additionally, in the case of an n-type conductivity body area and a p-type conductivity substrate, the doped wells can be arranged in an n-conductively doped well.

Between the source and drain, at least on the second deep well 3, there is a gate dielectric 7 on which a gate electrode 8 is arranged. Under the gate electrode 8 there is, in the body area, the channel area of the transistor. A field plate 9 made from electrically conductive material that is connected to the gate electrode 8 is arranged on an isolation area 10. The isolation area 10 can be a field oxide, but is preferably a shallow trench isolation (STI). Additional isolation areas 11 can be arranged in the second deep well 3 on the top side of the substrate and can separate the second contact area 5 and the third contact area 6 from each other or define the third contact area 6 on the side facing away from the second contact area 5.

A drift region 12 for the charge carriers that are accelerated toward the drain is located from the channel area toward the drain in the first deep well 2 in the vicinity of the top side. In the case of the described transistor structure, the isolation area 10 is arranged with a spacing d from the first contact area 4 of the drain connection D. This spacing d allows the dopant concentration to vary along the drift region 12 in the provided way such that the dopant concentration increases toward the drain. This will be described in more detail further below with reference to the production process.

Figure 2:
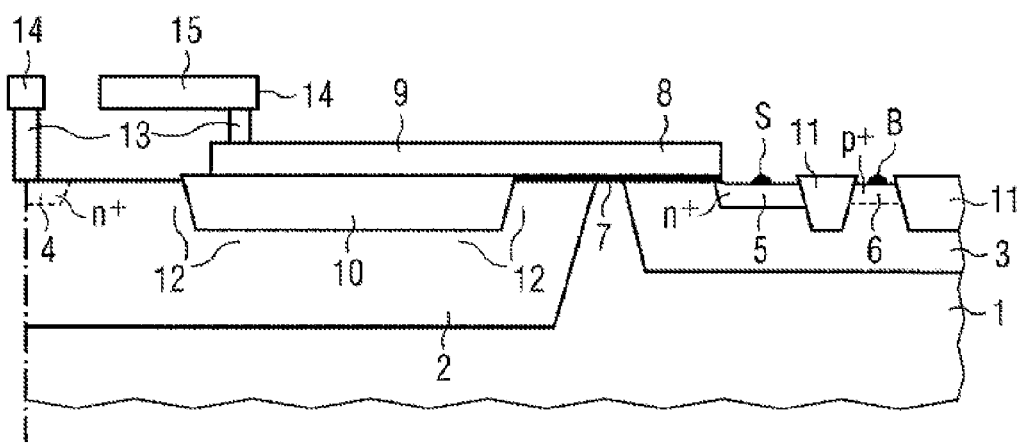
FIG. 2 shows a cross section through another embodiment of the HV transistor.

FIG. 2 shows a cross section through another embodiment. This embodiment shows a possibility for how the field plate 9 can be extended into the vicinity of the drain connection. Because the isolation area 10 does not extend, as in previously typical HV transistors, up to the first contact area 4 of the drain connection, the field plate 9 also ends with a spacing before the drain, and thus does not cover the entire length of the drift region 12. The embodiment according to FIG. 2 has via contacts 13 with which electrically conductive connections to a first metallization layer 14 are formed. This metallization layer 14 can belong to a multi-layer wiring of the component. In the first metallization layer 14, another field plate 15 is structured that projects over the area between the first contact area 4 and the isolation area 10 and in this way extends the electrically conductive field plate 9 in the direction toward the drain. The other components of this embodiment correspond to the components already explained with reference to FIG. 1 and are provided with the same reference symbols.

Figure 3:
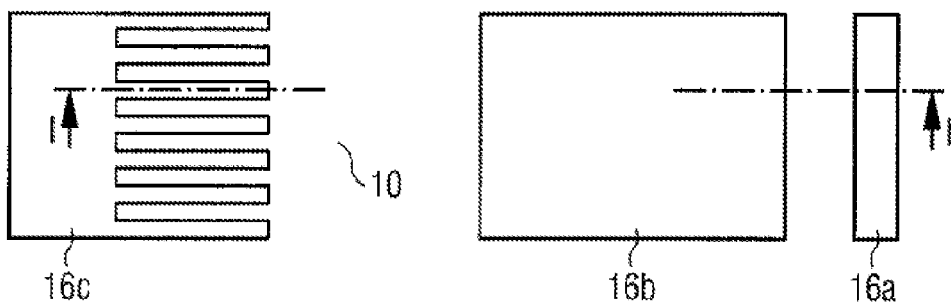
FIG. 3 shows a schematic top view of the active areas of another embodiment.

FIG. 3 shows a schematic top view of the arrangement of the active areas of one embodiment. The active areas are those portions of the top side of the substrate provided with the component in which semiconductor material is provided on the top side; therefore, in the active areas, the electrically operated components can be constructed. The passive areas that are occupied by insulating material are located on the top side of the substrate between the active areas. Included here are, in the case of the embodiments of FIGS. 1 and 2, the isolation area 10 and the additional isolation areas 11. In FIG. 3, the position of the cross section of FIG. 1 is marked. The active area 16a on the right side of FIG. 3 corresponds to the top view of the third contact area 6 in FIG. 1. The additional active area 16b shown at a small distance from the active area 16a (on the right side of FIG. 3) toward the center of FIG. 3 corresponds to the semiconductor top side between the isolation area 10 and the closest additional isolation area 11 on the right side of FIG. 1. The additional active area 16b therefore comprises a portion of the source-side top side of the first deep well 2, the channel area, and the second contact area 5 of the source. On the left side of FIG. 3, the active area 16c is shown that connects to the isolation area 10 on the drain side. This active area 16c can have a straight-line boundary to the isolation area 10 or, as in the embodiment shown in FIG. 3, can be provided with a comb-like structure. Finger-like projections of the isolation area 10 and finger-like projections of the active area 16c are interlocked with each other. This construction of the isolation area 10 is especially suitable for generating the dopant profile increasing toward the drain for the implantation of the first deep well 2.

Figure 4:
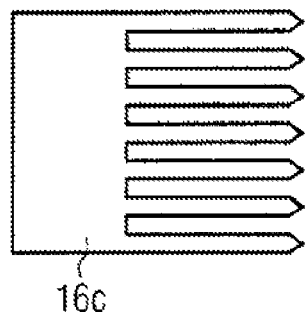
FIG. 4 shows a top view according to FIG. 3 for another embodiment.
Figure 4:
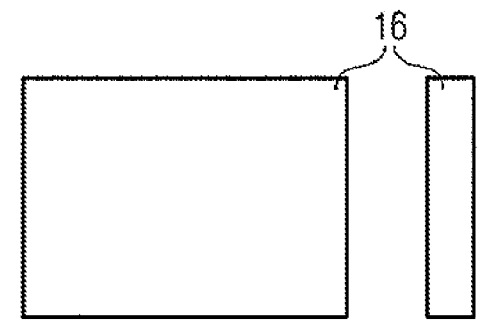
Figure 5:
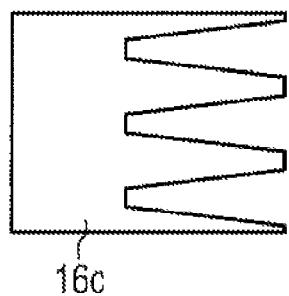
FIG. 5 shows a top view according to FIG. 3 for another embodiment.
Figure 5:
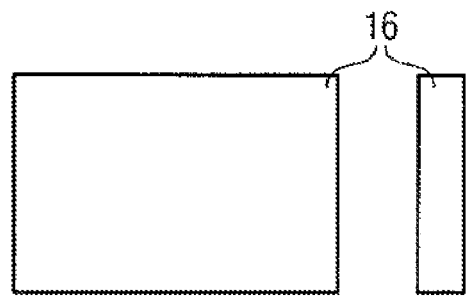
Figure 6:
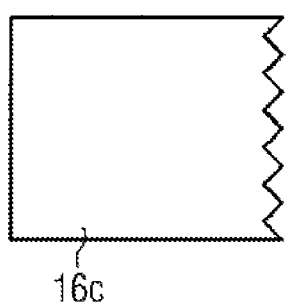
FIG. 6 shows a top view according to FIG. 3 for another embodiment.
Figure 6:
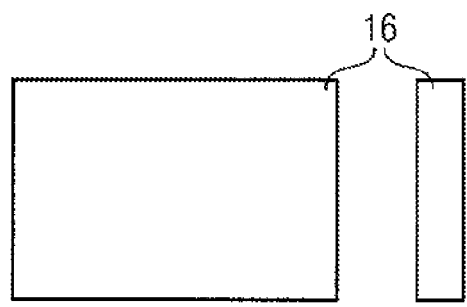

FIGS. 4-6 show additional schematic top views according to FIG. 3 for other implementations of the active areas. In the case of the embodiment according to FIG. 4, the finger-like projections of the drain-side active area 16c have tips or tapers at their ends. Corresponding tapers could also be provided at the ends of the finger-like projections of the isolation area 10. In the case of the embodiment of FIG. 5, the finger-like projections of the active area 16c are tapered over their entire length. The finger-like projections of the isolation area 10 are shaped symmetric to these tapers. In this way it can be created that, in the case of the implantation, more dopant increasing toward the drain with a gradual transition is led into the first deep well and correspondingly less dopant remains in the isolating material of the isolation area 10. FIG. 6 shows another embodiment in which the notches in the boundary between the isolation area 10 and the active area 16c arranged on the drain side are less deep, so that the serrated line shown in FIG. 6 forms the boundary between the areas.

The embodiments shown in FIGS. 3-6 are only selected examples that should illustrate the plurality of different possibilities. From these comes the result that, by means of the structure of the boundary between the isolation area 10 and the drain-side active area 16c, a significant adaptation of the lateral dopant profile generated with the implantation to the relevant requirements is possible. In this way, an optimization of the high-current response of the transistor is possible in a simple way, together with the additional advantage of an increased SOA (safe operating area). This advantage is achieved without the use of additional masks. Therefore, the production process is especially economical and can be performed in the context of a standard process. In addition, this production is also possible with a small thermal budget, and therefore, the implantation into the drift region can be used simultaneously for the production of other components, such as, for example, for the body area of a complementary PFET transistor. The production process becomes more effective the smaller the typical processing dimensions are for the STI areas (the so-called ground rules). That is, the HV transistor works even better, for example, in a 0.13 μm process than in a 0.18 μm process. The horizontal structure of the area of the drift region relative to the substrate top side and the associated lateral dopant profile can be produced even more uniformly and even more consistently, namely, in the case of smaller STI dimensions and smaller ground rules.

In the production process in which silicides are formed, the formation of silicides of the drift region outside of the first contact area 4 can be prevented by means of a silicide blocking mask. Alternatively, polysilicon strips of minimal width and spacings could be arranged on the top side, so that the formation of silicides is prevented in the active areas.

If a thermal budget is provided, the dopant profile can be adjusted by means of a thermally created diffusion of the dopant according to relevant defaults. Here, attention must be paid, if possible, that the typical diffusion lengths lie at least on the order of magnitude of the minimal dimensions of the opening of the relevant implantation mask.

Figure 7:
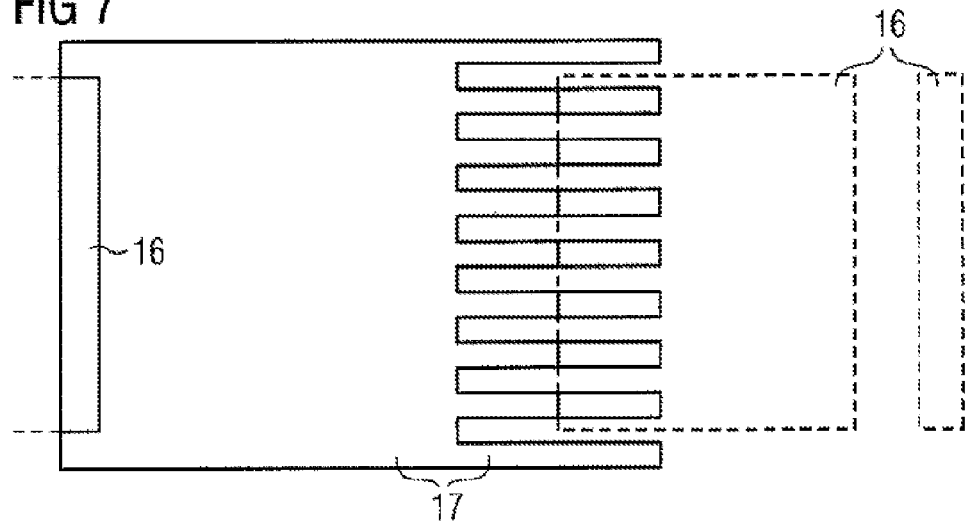
FIG. 7 shows a top view according to FIG. 3 with an implantation mask.
Figure 8:
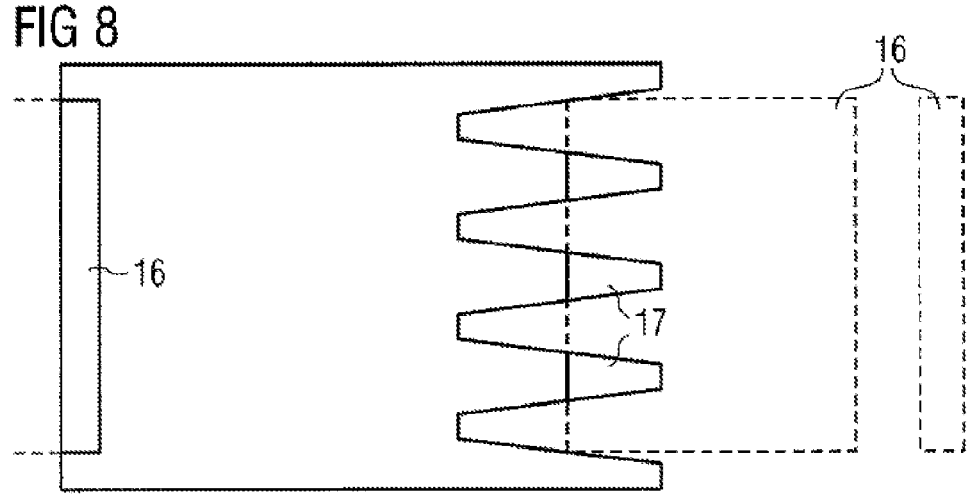
FIG. 8 shows a top view according to FIG. 7 for another implementation of the implantation mask.
Figure 9:
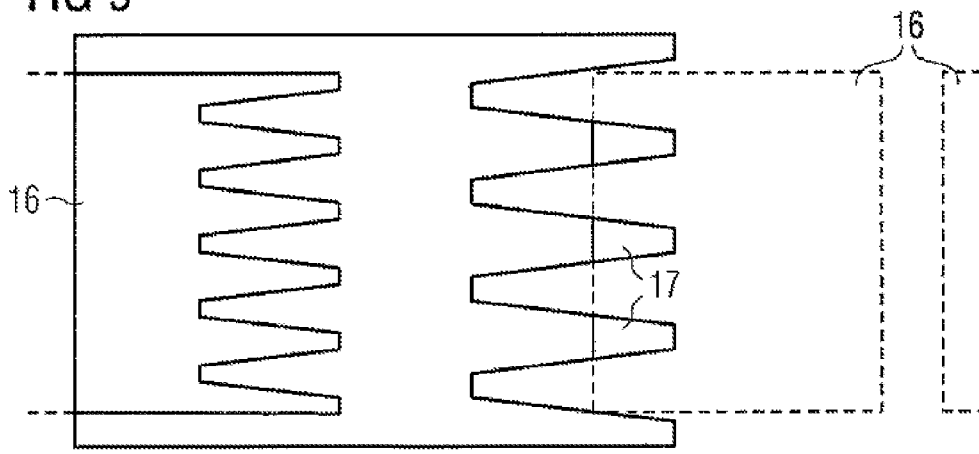
FIG. 9 shows a top view according to FIG. 8 for another implementation of the active area.

FIGS. 7-9 show schematic top views of the active areas 16 of different embodiments, as well as the shape and size of the opening 17 of an implantation mask. This implantation mask is provided for the implantation of the dopant of the first deep well. The pn junction between the body area and the first deep well can be constructed with a graded dopant concentration. This means that a doping of the body area for a first conductivity type, for example, as in the embodiment of FIG. 1 for $p^+$-type conductivity compensates continuously toward the drain with dopant atoms for the opposite conductivity type and is finally overcompensated, so that a concentration of the doping increasing in the direction toward the drain is achieved not only in the first deep well, but also the pn junction between the areas of different conductivity types is graded. The pn junction between the channel and drift region can be constructed less rigidly in this way, by means of which the HV transistor can be further improved. For this purpose, the openings 17 of the implantation mask have finger-like projections on the source side. In the embodiment of FIG. 7, it involves parallel strip-shaped openings of constant width, while, in the case of the embodiment of FIG. 8, these openings are tapered in the direction toward the source. FIG. 9 shows an embodiment in which an implantation mask is used according to the example of FIG. 8 in connection with an embodiment with an active area corresponding to the embodiment of FIG. 5. Accordingly, the different implantation masks can be combined with different implementations of the active areas. The shown possibilities represent only one selection that should illustrate the use of the implantation mask.

The extent of the gate electrode 8, which can be, for example, doped polysilicon that is electrically conductive, over the isolation area as a field plate 9 contributes to depletion of the drift region from charge carriers and therefore permits a higher dopant concentration to be provided in the drift region. Because for this HV transistor a spacing d is provided between the isolation area 10 and the first contact area 4 for the drain connection D, the field plate 9 cannot be expanded over the entire drift region up to the drain connection D. The embodiment according to FIG. 2 opens up a possibility, through the structuring of the additional field plate 15 in the first metal plane 14, of extending the field plate 9 nearly up to the drain connection D. Because the spacing between the metallization layer 14 and the semiconductor material corresponds approximately to the thickness of the isolation area 10, the additional field plate 15 has, with reference to the semiconductor material of the drift region 12, approximately the same effect as the field plate 9 above the isolation area 10. Additional track conductors, in particular, wiring of the component, can be structured in the first metal plane. An intermediate metal dielectric not shown in the figures and/or suitable passivation layers are provided in a known way between the substrate and the metallization layer 14, as well as between the different metal planes of the wiring.

The high-voltage transistor and the production method allow an optimization of the current load capacity of the drift region by means of relatively simple modifications of the masks used for production in the scope of a standard production process. The described advantages therefore can be achieved without significant additional processing expense. Due to the low additional expense and the low complexity of the component structure according to the invention, these improvements can be used for a plurality of different HV transistors.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

What is claimed is:

1. A method for production of a high-voltage transistor, comprising the steps of:
   providing doped wells and an isolation area on a top side of a substrate made from semiconductor material, where, of these wells, a first deep well is provided for a drift region running partially under the isolation area between a source and a drain, and a second deep well is provided for a body area;
   providing the first deep well with a dopant concentration that increases toward the drain;
   forming the isolation area before the first deep well is produced;
   performing an implantation of dopant for forming the first deep well, wherein the dopant is introduced, in part, directly into the semiconductor material and, in part, through the isolation area into the semiconductor material; and
   arranging the isolation area with a spacing to the drain such that a generated dopant profile causes the increase of the dopant concentration toward the drain,
   wherein an implantation mask is used for the implantation of dopant for forming the first deep well, the implantation mask being different from the isolation area.

2. The method according to claim 1, wherein the isolation area is serrated and/or shaped like a comb on the drain side.

3. The method according to claim 1, wherein the implantation is performed in several steps with varied implantation energy and implantation dose.

4. The method according to claim 1, wherein the implantation of dopant is performed for the production of the first deep well by using of an implantation mask, and
   wherein the implantation mask is provided with an opening that has source-side dimensions at least on the order of magnitude of a thermally generated diffusion of the dopant.

5. The method according to claim 4, wherein the implantation mask is provided on the source side with a serrated and/or comb-like opening.

6. The method according to claim 5, wherein the isolation area is formed before the first deep well is produced, and the isolation area is serrated and/or shaped like a comb on the drain side.

7. The method according to claim 1, wherein the isolation area is formed by one of a field oxide and a shallow trench isolation.

8. The method according to claim 1, wherein the isolation area is arranged at a distance from drain,
   wherein the drift region comprises a section of the first deep well extending under the isolation area, and
   wherein the dopant concentration of the first deep well is smaller throughout this section than in a region located between the isolation area and drain.

9. The method according to claim 1, wherein the isolation area is provided with a plurality of finger-like projections extending toward the drain,
   wherein the isolation area is arranged at a distance from drain,
   wherein the drift region comprises a section of the first deep well extending under the isolation area, and
   wherein the dopant concentration of the first deep well is smaller throughout this section than in a region located between the isolation area and drain.

10. The method according to claim 1, wherein the isolation area is provided with a plurality of finger-like projections extending toward the drain,
    wherein the isolation area is formed by one of a field oxide and a shallow trench isolation,
    wherein the isolation area is arranged at a distance from drain,
    wherein the drift region comprises a section of the first deep well extending under the isolation area, and
    wherein the dopant concentration of the first deep well is smaller throughout this section than in a region located between the isolation area and drain.

11. The method according to claim 1, further comprising:
    a gate electrode being provided, the gate electrode forming a field plate on the isolation area; and
    a metallization layer including a further field plate being connected in an electrically conductive way to the gate electrode, the metallization layer projecting over an area of the first deep well between the isolation area and drain.

12. A method for production of a high-voltage transistor, comprising the steps of:
    providing doped wells and an isolation area on a top side of a substrate made from semiconductor material, where, of these wells, a first deep well is provided for a drift region running partially under the isolation area between a source and a drain, and a second deep well is provided for a body area; and
    providing the first deep well with a dopant concentration that increases toward the drain,
    wherein the first deep well is produced by an implantation of dopant before the isolation area is formed, and
    wherein a top-side layer of the doped first deep well is removed during the production of the isolation area such that a remaining dopant profile causes the increase of the dopant concentration toward the drain.

13. A method for production of a high-voltage transistor, comprising the steps of:
    providing doped wells and an isolation area on a top side of a substrate made from semiconductor material, where, of these wells, a first deep well is provided for a drift region running partially under the isolation area between a source and a drain, and a second deep well is provided for a body area; and
    providing the first deep well with a dopant concentration that increases toward the drain,
    wherein the isolation area is provided with a plurality of finger-like projections, each of the finger-like projections extending in the direction toward the drain.

14. The method according to one of claim 13, 9 or 10, wherein the plurality of finger-like projections are tapered so that widths of the finger-like projections viewed in a direction perpendicular to the top side decrease towards drain.

* * * * *